United States Patent [19]

Sawada et al.

[11] Patent Number: 4,757,217

[45] Date of Patent: Jul. 12, 1988

[54] REFRESH OPERATION CONTROL CIRCUIT FOR SEMICONDUCTOR DEVICE

[75] Inventors: Kazuhiro Sawada, Yokohama; Takayasu Sakurai, Tokyo; Kazutaka Nogami, Kawasaki, all of Japan

[73] Assignee: Kabushiki Kaisha Toshiba, Kanagawa, Japan

[21] Appl. No.: 11,882

[22] Filed: Feb. 6, 1987

[30] Foreign Application Priority Data

Feb. 13, 1986 [JP] Japan ................. 61-29320

[51] Int. Cl.$^4$ .......................................... H03K 3/356
[52] U.S. Cl. ...................................... 307/480; 307/451; 307/481; 307/518; 307/269; 307/272.1; 365/222
[58] Field of Search .............. 307/443, 451, 452, 480, 307/481, 518, 362, 555, 558, 269, 272 R; 328/109, 116, 152; 365/222

[56] References Cited

U.S. PATENT DOCUMENTS

| | | | |
|---|---|---|---|
| 4,403,192 | 9/1983 | Williman | 328/109 X |
| 4,406,013 | 9/1983 | Reese et al. | 365/222 X |
| 4,420,695 | 12/1983 | Fisher | 328/109 X |
| 4,578,782 | 3/1986 | Kraft et al. | 365/222 |
| 4,620,118 | 10/1986 | Barber | 328/109 X |
| 4,622,668 | 11/1986 | Dancker et al. | 365/222 X |
| 4,625,301 | 11/1986 | Berger | 365/189 X |
| 4,677,592 | 6/1987 | Sakurai et al. | 365/222 |

OTHER PUBLICATIONS

Japanese Patent Publication (Kokoku) No. 55-49341; Hirotani et al., Jul. 23, 1974.
Japanese Patent Publication Nos. 61-5495 and 61-42794.

*Primary Examiner*—Stanley D. Miller
*Assistant Examiner*—D. R. Hudspeth
*Attorney, Agent, or Firm*—Finnegan, Henderson, Farabow, Garrett and Dunner

[57] ABSTRACT

This invention provides a refresh operation control circuit for a semiconductor memory device. Two flip-flop circuits respectively temporarily hold a normal read start command signal and a refresh start command signal generated within the memory device. A normal operation/refresh operation priority determining circuit wherein 2-input logic circuits are cross-connected so that one output in each case of each of these two flip-flop circuits provides one input of the other flip-flop circuit. The priority determining circuit determines the priority of normal read operation and refresh operation in accordance with the logic level relationship of the one inputs. Either control of the start of normal read operation or control of the start of refresh operation is carried out in accordance with the output of this determination.

8 Claims, 5 Drawing Sheets

REFRESH OPERATION CONTROL CIRCUIT FOR SEMICONDUCTOR DEVICE

BACKGROUND OF THE INVENTION

1. Field of the Invention

This invention relates to a refresh operation control circuit for a semiconductor device. In particular, the invention relates to a refresh operation control circuit that manages and controls the timing of normal memory operations and refresh operations in a semiconductor memory capable of carrying out a refresh operation in the idle time of normal memory operation.

2. Description of the Related Art

A semiconductor memory which needs a refresh operation is a type of RAM (random access memory) in which the memory cells consist, for example, of a transistor and a capacitor. Virtual static RAMs are constructed such that the normal read operation and refresh operation are conducted by time sharing in the same access cycle, so that the user is not aware of the refresh operation (the refresh operation is invisible to the user). These RAMs are proposed in Japanese Patent Applications No. Sho. 59-163508 and No. Sho. 59-111894 of the same assignee. FIG. 1 shows an example of the construction of the memory cell core region that constitutes the major part of such a RAM. FIG. 2 shows an example of the timing chart of its operation. The characteristic feature of such a RAM is that the selected word lines of a memory cell array 51 and sense amplifiers 52 are respectively pulse-driven. Thus the data sensed by a sense amplifier by the normal read operation is transmitted to a buffer register 54 by a column decoder 53, where it is temporarily stored, and then read out to an input/output buffer 55. Since the electrical connection of sense amplifiers 52 and buffer registers 54 is switched with a prescribed timing, the refresh operation can be conducted during the idle time of normal memory operation. Specifically, a word line WL1 corresponding to the address specified by an address (ADD) signal and chip enable bar ($\overline{CE}$) signal is opened for a certain period. During this period sense amplifiers 52 are operated in response to a sense amplifier enable (SAE) signal to sense and amplify data from memory cell array 51. This data is then re-written into the memory cells from which it was read. After this, a column decoder 53 is operated by a column decoder enable (CDE) signal. Under the control of its output the output of sense amplifier 52 is transmitted to buffer register 54. In response to a buffer register enable (BRE) signal, data is stored in buffer register 54. This data is output through an input/output buffer 55 from an output pin (not shown) as output data OUT. During the period until this data is output, the CDE and SAE signals are disabled, so the bit lines of memory cell array 51 can be accessed. The refresh address signal now causes refresh word line RWL (connected to the memory cell being refreshed) to be open for a certain time. This refresh word line RWL is separate from word line WL1. During this refresh operation, the CDE signal is still disabled, so the sense amplifier output cannot be read. Next, when the $\overline{CE}$ signal is enabled, the series of operations from selection of the word line (e.g. selection of WL2) by the address signal up to the refresh operation are performed in the same way as described above.

It should be noted that, although, in the timing of the above operations, the refresh operation took place after the read data was determined by the read operation, this is not essential, and it is possible to carry out the refresh operation before the normal read operation, during address decoding. Furthermore, although in the above operation example, the normal memory operation and refresh operation were performed by time sharing during a single access cycle, it is not essential to carry out the refresh operation every cycle. Normal memory operation and refresh operation can be performed by time sharing, as described above, in just those cycles in which refreshing is needed.

Thus a refresh timing control circuit is needed to manage and control the timing of refresh such that refresh operation is automatically carried out during the idle time of normal memory operation, as described above. Realization of a simple practical circuit to achieve this was required.

SUMMARY OF THE INVENTION

An object of this invention is to provide a simple practical circuit to manage and control the timing of refresh such that the refresh operation is automatically carried out in the idle time of normal memory operation.

A further object of this invention is to provide a refresh operation timing control circuit of a semiconductor memory device that can effect management and control by a simple circuit construction such that the refresh operation is carried out with the appropriate timing.

This invention constitutes a refresh operation timing control circuit for a semiconductor memory device that automatically manages and controls the refresh operation in the idle time of normal memory operation. Two flip-flop circuits temporarily hold a normal read start command signal and a refresh start command signal, respectively, generated within the memory device. A normal operation/refresh operation priority determining circuit wherein two 2-input logic circuits are cross-connected so that one output in each case of each of these two flip-flop circuits provides one input of the other flip-flop circuit. The priority determining circuit determines the priority of normal read operation and refresh operation in accordance with the logic level relationship of the inputs. Either control of the start of normal read operation or control of the start of refresh operation is carried out in accordance with the output of this determination.

This invention provides a refresh operation control circuit for controlling the normal read operation and the refresh operation of a semiconductor device, the device generating a normal start signal for starting the normal read operation and a refresh start signal for starting the refresh operation, comprising: first circuit means for latching the normal start signal; second circuit means for latching the refresh start signal; and priority determining circuit means generating first and second output signals and responsive to the first and second circuit means for determining priority between the first and second output signals, the first output signal for controlling the normal read operation and the second output signal for controlling the refresh operation of the device.

When this priority determining circuit sequentially inputs two start command signals in a single access cycle, it gives priority to the signal that is input first and carries out control of the start of the corresponding operation—either normal operation or refresh operation—and, after this operation, controls the start of the operation corresponding to the remaining start command signal. Even if two different kinds of start command signals are input at the same time, this priority determining circuit controls the start of operation corresponding to one or another of the start command signals. Then, after this operation is completed, the circuit controls the start of operation corresponding to the remaining start command signal. If only one kind of start command signal is input during a single access cycle, then it controls the start of just the operation corresponding to the start command signal. Thus it is possible to automatically interlace the refresh operation in the idle time of the normal memory operation, so that a virtual static memory, in which the refresh operation is hidden from the user, is achieved. Furthermore, as this priority determining circuit is constructed by cross-connecting two 2-input logic circuits, a refresh operation timing control circuit in which the two different kinds of start command signals are temporarily held in a front-end stage can be realized cheaply using a simple circuit construction achieved by connecting two set-reset FF circuits.

DETAILED DESCRIPTION OF THE PREFERRED EMBODIMENTS

Figure 1:
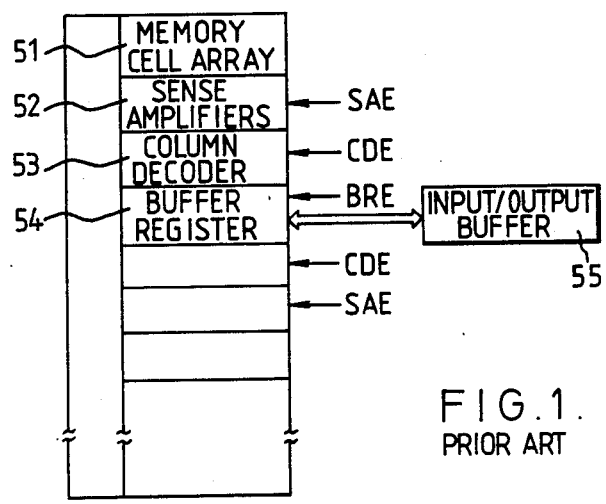
FIG. 1 is a constructional diagram of part of a virtual static memory, as presently proposed.
Figure 3:
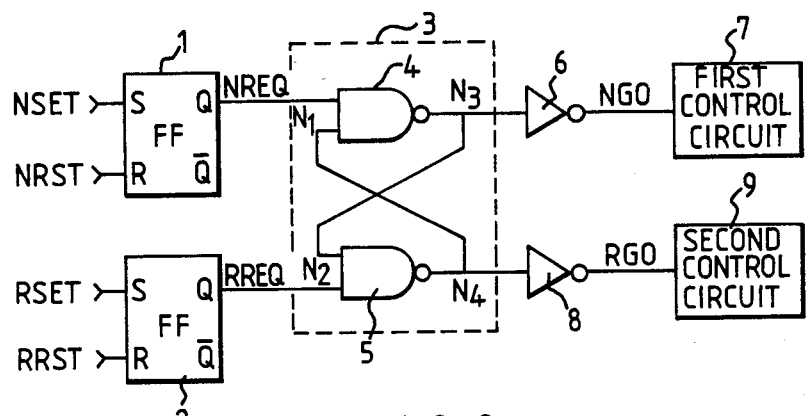
FIG. 3 is a logic circuit diagram showing an embodiment of a refresh operation timing circuit for a semiconductor device according to this invention.

An embodiment of the invention is described in detail below with reference to the drawings. The refresh action dynamic control circuit shown in FIG. 3 is formed on an integrated circuit chip as part of the semiconductor memory device described above with reference to FIG. 1. It performs the refresh operation during the periods when normal memory operation is not taking place. In more detail, a first set-reset flip-flop (FF) 1 has normal read operation (normal operation) start command signal NSET as its set input S, and has normal operation word line shut-off signal NRST as its reset input R. A second set-reset FF 2 has refresh start command signal RSET as its set input S, and has refresh word line shut-off signal RRST as its reset input R. A normal operation/refresh operation priority determining circuit 3 is formed by cross-connecting two 2-input NAND circuits 4 and 5 (i.e. connecting them so that the output of one circuit is one of the two inputs of the other circuit). The Q output (normal operation request signal NREQ) of first FF circuit 1 is fed to one input of first 2-input NAND circuit 4 and the Q output (refresh operation request signal RREQ) of second FF circuit 2 is fed to one input of second 2-input NAND circuit 5. The output of this first 2-input NAND circuit 4 undergoes waveform shaping and inversion in a first CMOS (complementary insulated gate) type inverter circuit 6. The output of the first CMOS is in turn connected to the input of a first control circuit 7 for control of starting of normal operation. The output of second 2-input NAND circuit 5 undergoes waveform shaping and inversion in a second CMOS inverter circuit 8. The output of the second CMOS is in turn connected to the input of a second control circuit 9 for control of the starting of the refresh operation.

Figure 4:
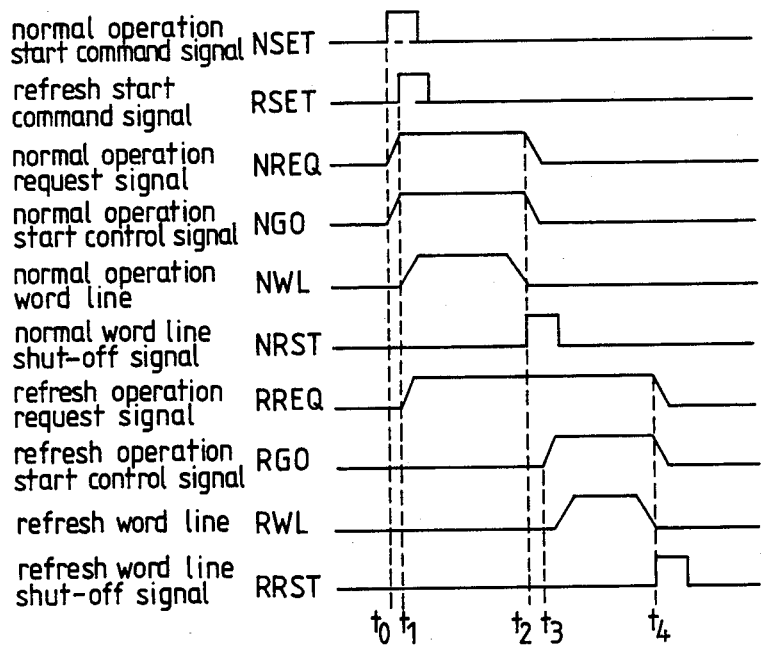
FIG. 4 is a timing chart showing the operation of the circuit of FIG. 3.

The action of the refresh operation timing control circuit will now be described with reference to the timing chart of FIG. 4. The memory cycle starts when the address input of the semiconductor memory device changes, or the $\overline{CE}$ signal goes to the "enable" state, and normal operation start command signal NSET, constituting the set input of first FF circuit 1, is input from a memory control circuit (not shown) at timepoint t0. Now, for example, at a timepoint t1 somewhat later than timepoint t0, refresh start command signal RSET constituting the set input of second FF circuit 2 is input from a refresh timer circuit (not shown).

Figure 2:
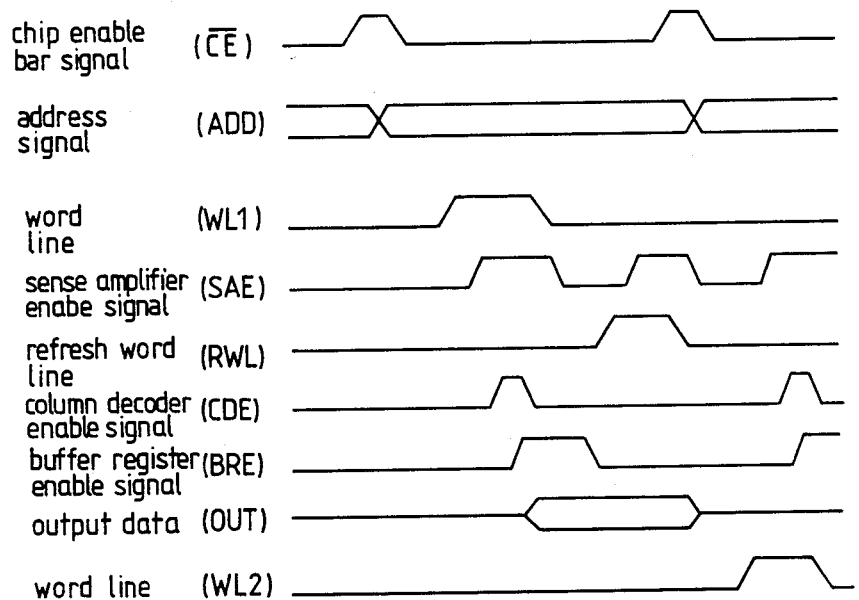
FIG. 2 is a timing chart showing the operation of the memory of FIG. 1.

Consequently the Q output (NREQ) of first FF circuit 1 becomes high level "H", after which the Q output (RREQ) of second FF circuit 2 becomes high level "H". However, in priority determining circuit 3, respective corresponding input nodes N1 of first 2-input NAND circuit 4 and N2 of second 2-input NAND circuit 5 are held at "H" level until the rise of these signals NREQ and RREQ. In this way, if the NREQ signal becomes "H" level before RREQ, output node N3 of first 2-input NAND circuit 4 becomes low-level "L", while output node N4 of second 2-input NAND circuit 5 stays at "H" level. Consequently, output signal NGO of first inverter circuit 6 first becomes "H" level, with the result that first control circuit 7 delivers for a fixed period an "H" level signal. This opens word line NWL corresponding to the address input for commencement of normal operation. In contrast, output signal RGO of second inverter circuit 8 stays at "L" level, causing second control circuit 9 to be held in the same state. During the period while signal NGO is "H" level, normal read operation is performed as described earlier with reference to FIG. 2. However, at a timepoint t2, after signal CDE and signal BRE have been respectively disabled, the selection signal of word line NWL becomes "L", causing the selection of word line NWL to cease. At this point normal word line shut-off signal NRST is input to reset the input of first FF circuit 1 from the memory control circuit (not shown). This causes output NREQ of first FF circuit 1 to go to "L" level, output node N3 of first 2-input NAND circuit 4 to go to "H" level, and output signal NGO of first inverter circuit 6 to go to "L" level. In contrast, output RREQ of second FF circuit 2 that became "H" at timepoint t1 retains its "H" level. When output node N3 of first 2-input NAND circuit 4 (in other words, one of the input nodes, N2, of second 2-input NAND circuit 5) becomes "H" level, output node N4 of second 2-input NAND circuit 5 becomes "L" Level. As a result, output signal RGO of second inverter 8 becomes "H" level at timepoint t3. From t2 to t3 is the delay time associated with the operation of the circuit described above. Consequently, second control circuit 9 causes the signal that opens word line RWL corresponding to the refresh address for the start of the refresh operation to be "H" level for a fixed time, and carries out the refresh operation in the same way as described above with reference to FIG. 2, for the period that the RGO signal is "H" level. During this period, second control circuit 9 effects control such that signal CDE is disabled, so the output of the sense amplifier cannot be read. When the selection signal of refresh word line RWL becomes "L" level, refresh word line shut-off signal RRST, constituting the reset input of second FF circuit 2, is input from a memory control circuit (not shown) at timepoint t4, when the selection of refresh word line RWL ceases. As a result, output RREQ of second FF circuit 2 becomes "L" level, output node N4 of second 2-input NAND circuit 5 becomes "H" level, and output signal RGO of second inverter 3 becomes "L" level.

In the above description, the refresh operation was performed in the same access cycle in advance of the normal read operation, i.e. the refresh operation was interlaced in the delay time of the data output circuit. However, if the refresh start command signal RSET is generated in advance of the normal operation start command NSET, control is effected such that refresh operation, as described in the above example, is interlaced in advance of the normal read operation (in the delay time accompanying the decoding, etc., carried out by the address input circuit).

Figure 5:
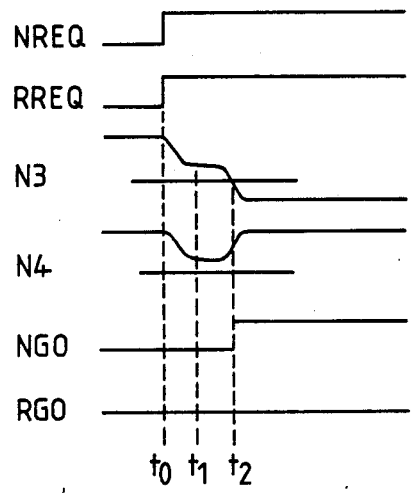
FIG. 5 is a timing chart showing another embodiment of the operation.

In contrast, as in the operation timing shown in FIG. 5, when normal operation start command signal NSET and refresh operation start command signal RSET are input simultaneously, NREQ and RREQ go to "H" level at the same timepoint t0. This causes both output node N3 of first 2-input NAND circuit 4 and output node N4 of second 2-input NAND circuit 5 to start to drop. Once they have fallen to an intermediate potential between "H" level and "L" level at timepoint t1, subsequently, due to differences in the input transistor characteristics of 2-input NAND circuits 4 and 5, one will be latched at "H" level while the other is latched at "L" level. In the case illustrated, node N3 is latched at "L" level and node N4 is latched at "H" level. If at time t2 the level of node N3 falls past the threshold value VTH of first inverter 6, its output signal NGO becomes "H" level, and normal read operation starts, as described previously. If this situation arises, it is desirable to set the threshold value VTH of the inverters 6 and 8 somewhat lower than this intermediate potential, so that inverters 6 and 8 do not both, in an erroneous response to the potentials of these nodes N3 and N4, output level "H" before the potentials of these nodes are latched. In other words, the movement of potential of nodes N3 and N4 must be correctly shaped for inverters 6 and 8. If the "H" level is Vcc potential and the "L" level is ground potential, the intermediate level is about ½ of Vcc.

Control is effected such that only normal read operation is started if only the normal operation start command signal NSET is input. If, on the other hand, only the refresh operation start command signal NSET is input during a single access cycle, only the refresh operation is started.

Figure 6:
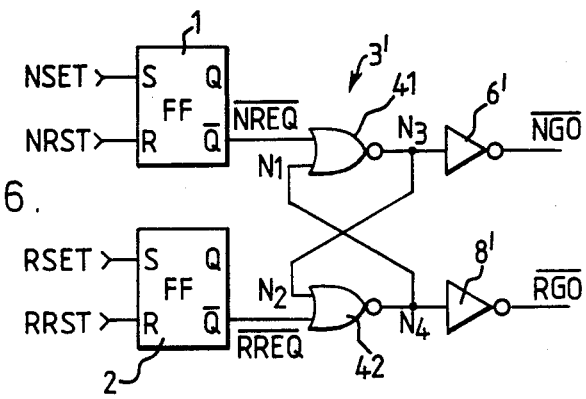
FIG. 6 is a logic circuit diagram showing another embodiment of the invention.

This invention is not restricted to the above embodiment. As shown in FIG. 6, it could be put into practice in a modified form, in which a priority determining circuit 3' is used, formed by cross-connecting two 2-input NOR circuits 41 and 42. The inputs to these circuits are provided by the $\overline{Q}$ output ($\overline{NREQ}$ signal) of first FF circuit 1 and the $\overline{Q}$ output ($\overline{RREQ}$ signal) of second FF circuit 2, signal $\overline{NGO}$ being output from first inverter 6' and signal $\overline{RGO}$ being output from second inverter 8'. Items in FIG. 6 which are the same as those in FIG. 3 are given the same reference numerals. The same operation is obtained as in the first embodiment, but for proper waveform shaping of the movement of the potentials of the nodes N3 and N4, the threshold values VTH' of inverters 6' and 8' must be set somewhat higher than the respective intermediate values (about ½ of Vcc).

Figure 7:
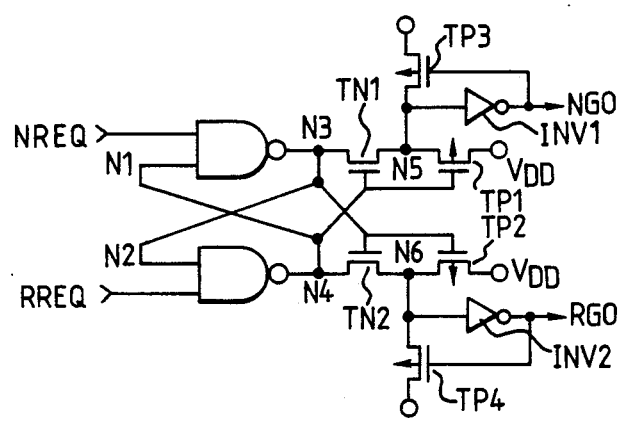
FIG. 7 is a logic circuit diagram showing another embodiment of the invention.
Figure 8:
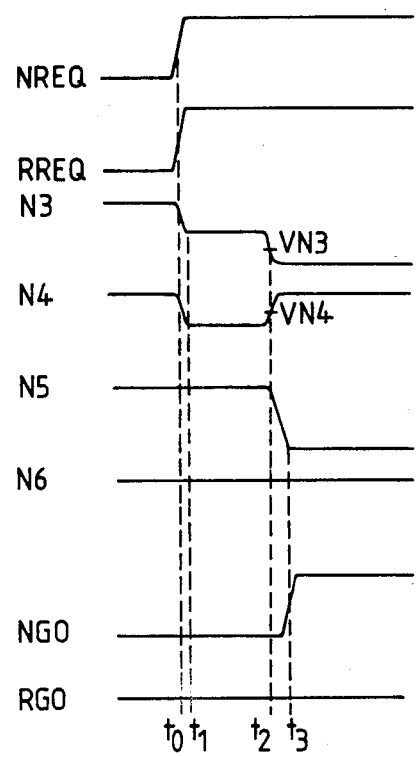
FIG. 8 is a timing chart showing the operation of the circuit of FIG. 7.

Next, another embodiment of the present invention is described by using FIG. 7 and FIG. 8. The circuit of this embodiment is one for solving the following problems in the threshold value control system shown in the embodiments described before.

For controlling the threshold value, it is necessary to adjust the gate width Wp and Wn of the p channel and n channel transistors of the inverters 6 and 8 shown in FIG. 3. For reducing the threshold value, the gate width Wp is made small, and as the result, a problem arises that the response speed of the outputs NGO and RGO is delayed.

Also, there is a problem that the threshold value is varied depending on variation of process such as that of gate width and it is unstable resulting is causing an erroneous operation.

Further, there arises a problem that at the time when the priority can not be determined, a through current flows in the inverter, thereby to bring increasing of current consumption.

FIG. 7 shows a control circuit diagram of another embodiment according to the present invention. FIG. 8 shows a schematic operational waveform diagram corresponding to each nodes in FIG. 7. In FIG. 7 and FIG. 8, like parts to those in FIG. 3 are described with like reference characters.

In FIG. 7, an inverter with the gate input N4 is provided between the VDD and the N3. A latch circuit comprising a P-channel transistor TP3 and INV1 is connected to the output N5. The output of the INV1 is the NGO signal.

Completely symmetrically with this, an inverter with the gate input N3 is provided between the VDD and the N4. A like latch circuit is connected to the output N6. The output of the INV2 is the RGO signal.

Refering now to the schematic operational waveform diagram of FIG. 8, the operation of the timing control circuit is described below.

Presume that two operation request signals NREQ and RREQ are simultaneously generated at timepoint to. In this case, the priority is not determined and the output nodes N3 and N4 of 2-input NAND circuit are held at the same intermediate potential from timepoint t1 to timepoint t2. For holding N3 and N4 at the same potential, the N-channel transistors TN1 and TN2 in FIG. 7 remain off and even for this period of time, a current is not consumed different from the case of threshold control. And even at timepoint t2, when the potential difference of N3 and N4 exceeds the threshold value VTN of the N-channel transistor, the priority is determined. FIG. 8 shown the case wherein N3 becomes "L" level and N4 "H" level and the NREQ signal has the priority. It shows the case wherein the difference |VN3−VN4| of the potential VN3 of N3 and the potential VN4 of N4 at timepoint t2 becomes larger than the threshold value VTN and TN1 is made on and TN2 remains off. As the result, at timepoint t3, the latch circuit comprising the TP3 and the INV1 is reversed and the NGO signal can be obtained. On the contrary, the RGO signal holds the latch output of TP4 and INV2 and the RGO signal remains "L". Compared with the threshold value control system, it is not necessary to provide transistor dimension for decreasing the response speed and there is no fear of unstable operation and erroneous operation due to variation of process.

Also, after the status becomes stable after timepoint t3, the N3 goes to "L" level and N4 "H" level, and the TN1 is held on. However, in the embodiment, the circuit is constituted of CMOS, both TP1 and TP3 are off, and no through current is produced and current consumption is not increased.

Figure 9:
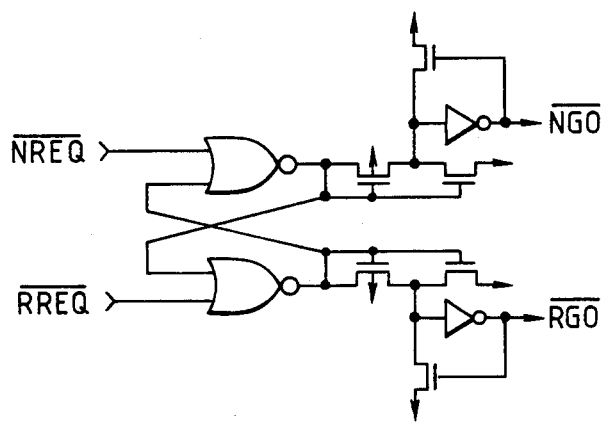
FIG. 9 is a logic circuit diagram showing another embodiment of the invention.

FIG. 9 shows another embodiment. In this embodiment, the circuit constituted for 2-input NAND circuit in FIG. 7 is constituted of 2-input NOR circuits. In the same manner as in FIG. 6, the fundamental operation is the same except that input/output signals are changed from positive logic to negative logic.

As described above, according to this invention a refresh timing control circuit of a semiconductor memory device wherein the refresh operation is automatically performed in the idle time of normal memory operation can be realized by a simple circuit construction employing two flip-flop circuits and a single priority determining circuit. This makes it possible to achieve a virtual static memory in which, although a refresh operation is required, it is hidden from the user.

Further, according to the embodiments shown in FIG. 7 and FIG. 9, a timing control circuit which is fast in response speed, little in current consumption, and strong to variation of process can be realized.

Various modifications and variations could be made to the invention without departing from the scope or spirit of the invention.

What is claimed is:

1. A refresh operation control circuit for controlling the normal read operation and the refresh operation of a dynamic memory semiconductor device, the device generating a normal start signal for starting the normal read operation and a refresh start signal for starting the refresh operation, comprising:

first circuit means for latching the normal start signal;
   second circuit means for latching the refresh start signal; and
   priority determining circuit means connected to receive the outputs of said first circuit means and said second circuit means, said priority determining circuit means being operative to determine the priority of said refresh operation and said normal read operation, wherein said priority determining circuit means outputs a first output signal for controlling the normal read operation and a second output signal for controlling the refresh operation; and
   waveform shaping means for receiving and shaping said first and second output signals.

2. The circuit of claim 1 wherein the dynamic memory semiconductor device also generates a normal stop signal for stopping the normal read operation and a refresh stop signal for stopping the refresh operation, the first circuit means includes a first input terminal for receiving the normal start signal and a second input terminal for receiving the normal stop signal and the second circuit means includes a third input terminal for receiving the refresh start signal and a fourth input terminal for receiving the refresh stop signal.

3. The circuit of claim 2 wherein the first and second circuit means each include a flip-flop.

4. The circuit of claim 1 wherein the priority determining means includes a pair of cross-connected 2-input logic circuits.

5. The circuit of claim 1 wherein waveform shaping means include inverters.

6. The circuit of claim 5 wherein the priority determining means includes two 2-input NAND circuits and the threshold value of the inverters are set lower than the potential midway between the input high level and the input low level of the inverters.

7. The circuit of claim 5 wherein the priority determining means includes two 2-input NOR circuits and the threshold value of the inverters are set higher than the potential midway between the input high level and the input low level of the inverters.

8. The circuit of claim 5 wherein the waveform shaping means include CMOS inverters and first and second latch circuits connected to the CMOS inverters, and the first and second output signals are outputted from the output terminals of the first and second latch circuits.

* * * * *